United States Patent
Bhalla et al.

(10) Patent No.: US 7,183,616 B2
(45) Date of Patent: Feb. 27, 2007

(54) HIGH SPEED SWITCHING MOSFETS USING MULTI-PARALLEL DIE PACKAGES WITH/WITHOUT SPECIAL LEADFRAMES

(75) Inventors: Anup Bhalla, Santa Clara, CA (US); Sik K Lui, Sunnyvale, CA (US); Leeshawn Luo, San Jose, CA (US); Yueh-Se Ho, Sunnyvale, CA (US)

(73) Assignee: Alpha & Omega Semiconductor, Ltd., Sunnyvale, CA (US)

( * ) Notice: Subject to any disclaimer, the term of this patent is extended or adjusted under 35 U.S.C. 154(b) by 45 days.

(21) Appl. No.: 10/208,275

(22) Filed: Jul. 30, 2002

(65) Prior Publication Data

US 2003/0183924 A1    Oct. 2, 2003

Related U.S. Application Data

(60) Provisional application No. 60/369,170, filed on Mar. 31, 2002.

(51) Int. Cl.
H01L 23/62 (2006.01)
H01L 29/94 (2006.01)
H01L 29/76 (2006.01)
H01L 31/119 (2006.01)
H01L 31/113 (2006.01)
H01L 23/34 (2006.01)
H01L 23/50 (2006.01)

(52) U.S. Cl. .................. 257/401; 257/341; 257/342; 257/343; 257/723; 257/E23.079

(58) Field of Classification Search ........ 257/341–343, 257/723–724, 666, 502, 401, E23.079
See application file for complete search history.

(56) References Cited

U.S. PATENT DOCUMENTS 5,459,655 A * 10/1995 Mori et al. .................. 363/132
6,020,636 A * 2/2000 Adishian ..................... 257/728
6,593,622 B2 * 7/2003 Kinzer et al. ................ 257/341
6,809,348 B1 * 10/2004 Suzuki et al. ................ 257/119

* cited by examiner

Primary Examiner—Luan Thai
(74) Attorney, Agent, or Firm—Bo-In Lin

(57) ABSTRACT

This invention discloses a method for configuring a power MOSFET package by packaging several paralleled and separated MOSFET chips in the assembly. The method further includes a step of connecting the gate pad on each of these MOSFET chips with a low-resistance gate bus. The package resistance and inductance are significantly reduced and switching speed and heat dissipation are substantially improved.

22 Claims, 5 Drawing Sheets

HIGH SPEED SWITCHING MOSFETS USING MULTI-PARALLEL DIE PACKAGES WITH/WITHOUT SPECIAL LEADFRAMES

This application claims priority to pending U.S. provisional patent application entitled HIGH SPEED SWITCHING MOSFETS USING MULTI-PARALLEL-DIE PACKAGES WITH/WITHOUT SPECIAL LEADFRAMES filed Mar. 31, 2002 by the same inventors of this Application and accorded Ser. No. 60/369,170, the benefit of its filing date being hereby claimed under Title 35 of the United States Code.

BACKGROUND OF THE INVENTION

1. Field of the Invention

The invention disclosed herein relates generally to the device layout and packaging configuration of power MOSFETs. More particularly, this invention relates to a novel and improved device layout and packaging configuration for fabricating and connecting power MOSFETs within electronic packages to achieve high speed switching, reduced power consumption and improved heat dissipation.

2. Description of the Prior Art

Conventional device layout and packaging configurations for fabricating and connecting a power metal-oxide semiconductor field effect transistor (MOSFET) within an electronic package suffer from parasitic effects such as source inductance Ls and gate resistance Rg which begin to dominate device switching behavior in high frequency applications >200 kHz. For a switched mode power supply, improvements in performance have been made for a power MOSFET by carefully optimizing the tradeoff between the conduction and switching losses. However, switching losses increase significantly when the induced device parasitic effects become more prominent. There are ever-increased demands to improve upon the conventional device layout and packaging configurations now commonly implemented for the power MOSFET to achieve faster switching operations with reduced power dissipation when the MOSFETs are used for higher frequency operation.

Recent advancements made in silicon technology allow for very low on-resistance power MOSFETs; small low-cost chips may be implemented to carry very high power densities. However, the small device area usually leads to high thermal resistance, and higher operating temperatures, because the heat is dissipated in a small area. Moreover, package parasitic inductance may become worse, since with small die there is only room for a few bond wires, spaced closer together. Thus, more heat will be dissipated in the MOSFET. This problem becomes more severe as lower device resistances and improved technology allow for higher operating currents for the same package size because the effect of parasitic inductance increases with operating current. Clearly, there is a need to reduce parasitic inductance, which in turn leads to lower power dissipation in the MOSFET. The gate resistance of a MOSFET slows down the switching speed of the MOSFET, also leading to higher power loss, and must therefore be minimized.

To present a clear contrast between the prior art configuration and that of the present invention, the example of a prior art SOIC8 package is first described as that shown in FIG. 1A. However, as will be described below the new and improved configuration of this invention is applicable to a wide variety of electronic packages other than the SOCI8 package. FIG. 1A shows a typical power MOSFET package 10 which includes a MOSFET device 15, i.e., the chip, connected to lead frames 20 by the use of wires 25, e.g., gold wires with a diameter of approximately 2 mils. A MOSFET device 15 that has a large area is commonly fabricated and applied that includes a plurality of gate-metal stripes, i.e., the gate buses 30. The gate buses 30 divide the source contact surface into several areas, and are needed to reduce gate resistance. The wires 25 are formed to connect the lead frames 20 to the surface of source contact. For the convenience of fabrication and cost savings, the wires 25 are formed to dispose on the source contact surface near the lead frames 20 such that the wires are shorter and easier to maneuver in the wiring processes. A separate gate contact 40 is also provided connected to the lead frame with a conductive gate wire 45. FIG. 1B shows the same device in a package where the source leads are not fused together to a single lead frame. The examples of a power MOSFET in an SOIC8 package as shown in the FIGS. 1A and 1B are typical configurations commonly implemented in the industry. The MOSFET chip as shown has a relatively large die size and then the die is segmented with the gate buses to reduce gate resistance. For the purpose of resolving the technical difficulties by reducing the gate resistance, source inductance and inductance induced power dissipations, two smaller MOSFET chips are arranged in parallel within the package as that shown in FIGS. 2A and 2B. However, the gate wires 45 as shown limit the source bondable areas for one of the devices. Only a few wires 25 may be used for the low die as that shown in FIG. 2A. A longer gate wire 45 is required, thus unduly increasing the gate resistance. In FIG. 2B, the layout is improved to accommodate more source wires 25 for the lower die, but now the source wires for the upper die are longer, as is the gate wire, leading to excessive parasitic inductance. Furthermore, in both FIGS. 2A and 2B a rotation of one die is required with respect to the other, resulting in two passes through the assembly process. If the two die were to be segmented by gate buses, as in FIGS. 1A and 1B, the source wires could not be evenly distributed over the source bonding areas of these die, which would inhibit the use of gate buses, and thereby penalize gate resistance.

As explained above, in addition to a design goal of reducing the package resistance, there is a need to reduce the inductance to reduce power dissipation for a MOSFET device when it is used to switch high currents at high frequencies. Therefore, a need still exists in the art to provide an improved layout and packaging configuration to resolve these difficulties.

SUMMARY OF THE PRESENT INVENTION

It is therefore an object of the present invention to provide an improved layout and packaging configuration for the power MOSFET to overcome the aforementioned difficulties encountered in the prior art.

Specifically, it is an object of the present invention to provide an improved MOSFET device layout and packaging configuration wherein multiple parallel MOSFET chips are connected using an extra gate pad to allow the gate pad of one MOSFET to be wired to that of the other. A low resistance wide metal bus connects the two gate pads on the MOSFET to minimize gate resistance. Significant improvement of package resistance and inductance is achieved.

Briefly in a preferred embodiment this invention discloses a method for configuring a power MOSFET package by packaging several paralleled and separated MOSFET chips in the assembly. The method further includes a step of making more than one gate pad on each MOSFET, and connecting these gate pads with a low-resistance gate bus.

This bus may be restricted to the region between the gate pads, or placed all around the device. Since the resistance of the gate metal between the gate pads appears in series with the next FET, this resistance is minimized using a wide gate metal bus. One single large pad capable of receiving a wire from the gate lead, and one from a companion device may also be used, but this tends to waste active silicon area. The package resistance and inductance are significantly reduced and switching speed and heat dissipation are substantially improved.

These and other objects and advantages of the present invention will no doubt become obvious to those of ordinary skill in the art after having read the following detailed description of the preferred embodiment, which is illustrated in the various drawing figures.

DETAILED DESCRIPTION OF THE METHOD

Figure 1A:
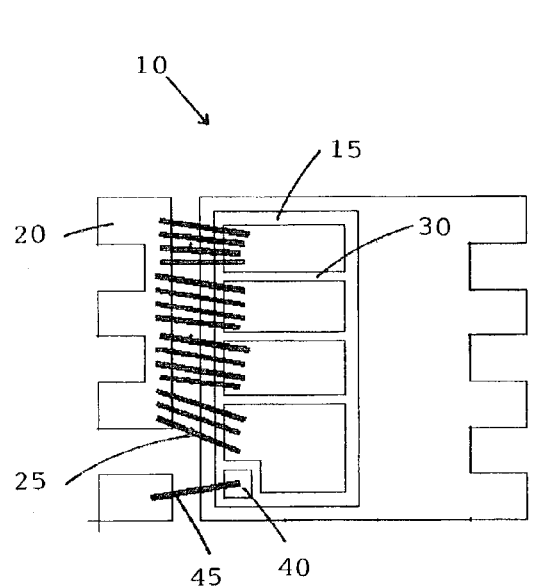
FIGS. 1A and 1B show top views of two conventional integrated circuit packages.
Figure 1B:
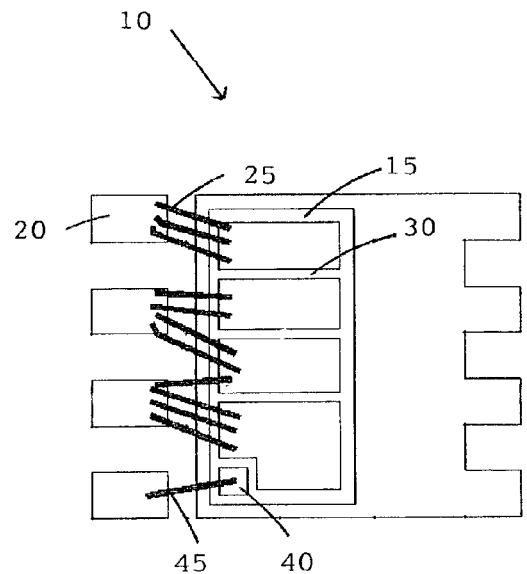
Figure 2A:
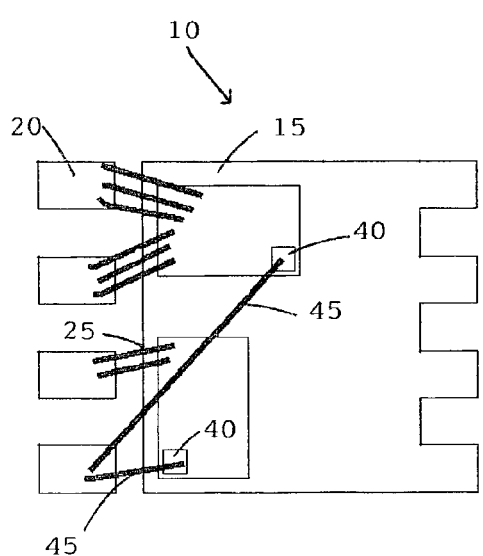
FIGS. 2A and 2B show top views of another two conventional integrated circuit packages.
Figure 2B:
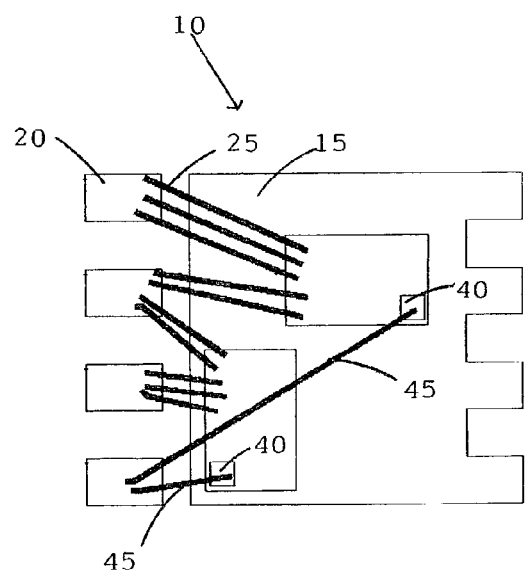
Figures 3A, 3B:
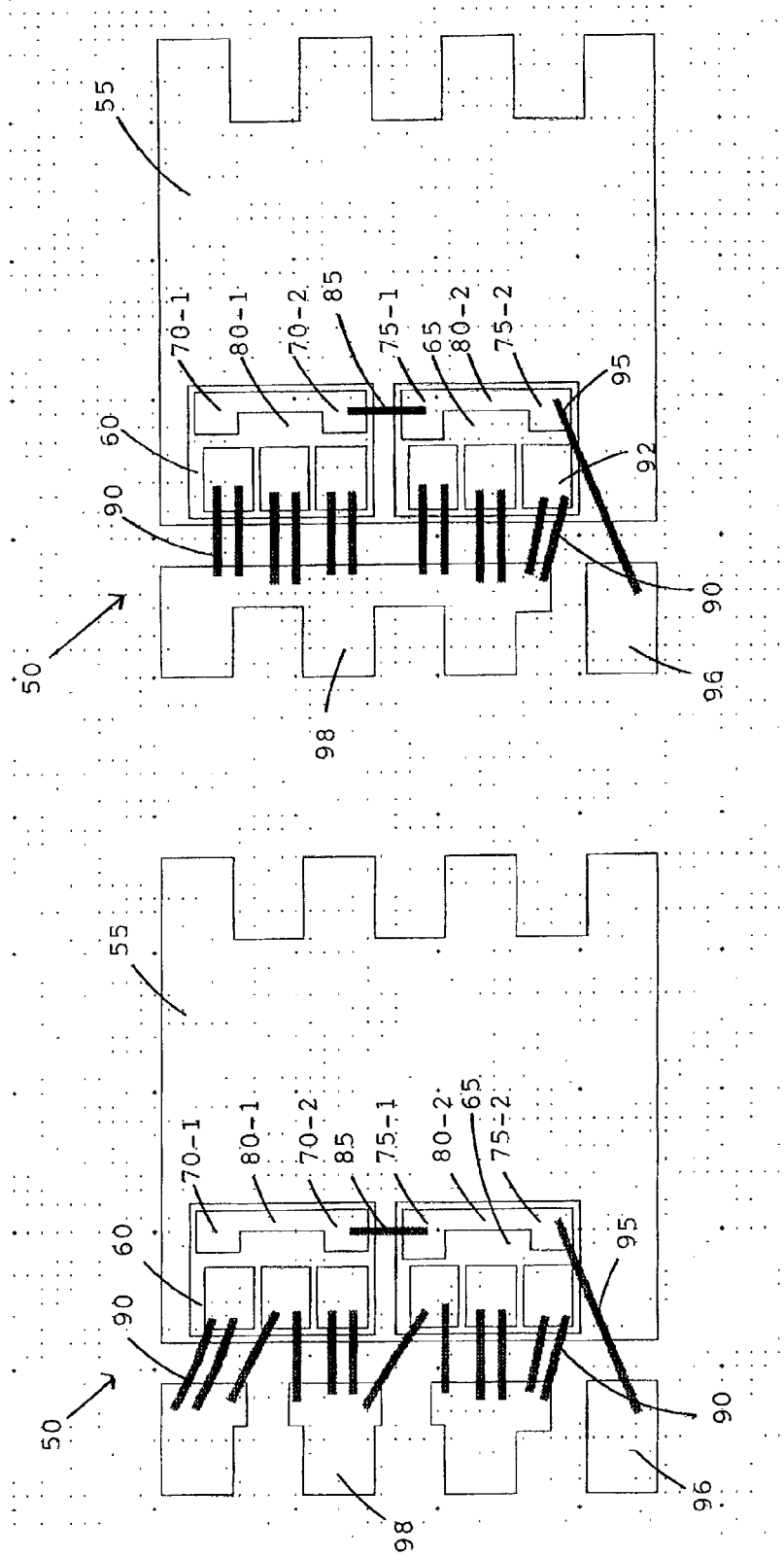
FIGS. 3A to 3B show top views of integrated circuit packages of this invention.
Figure 4A:
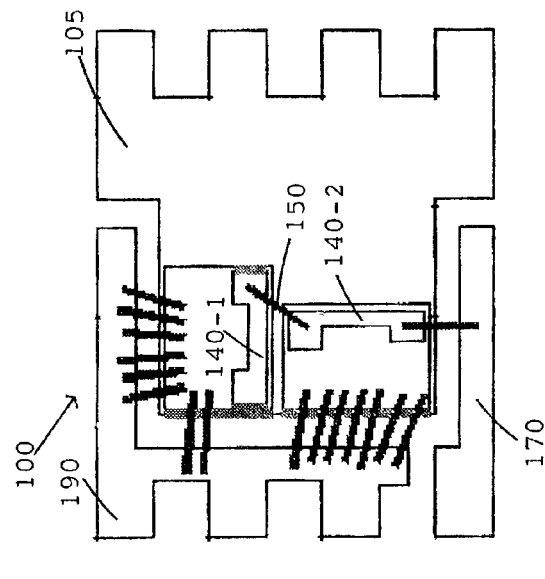
FIGS. 4A to 4D show top views of integrated circuit packages as alternate preferred embodiments of this invention.
Figure 4B:
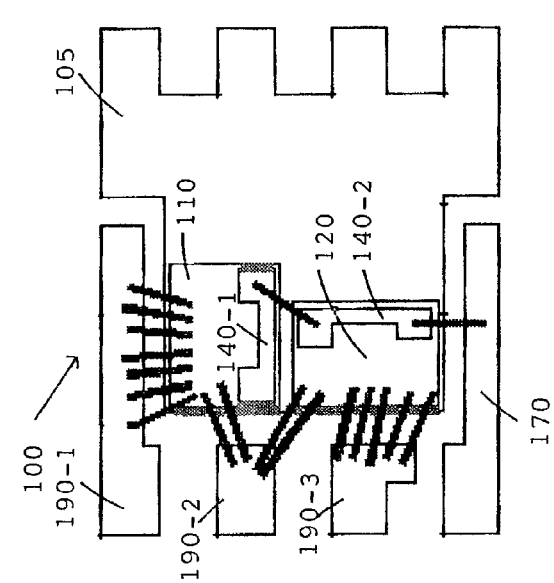
Figure 4C:
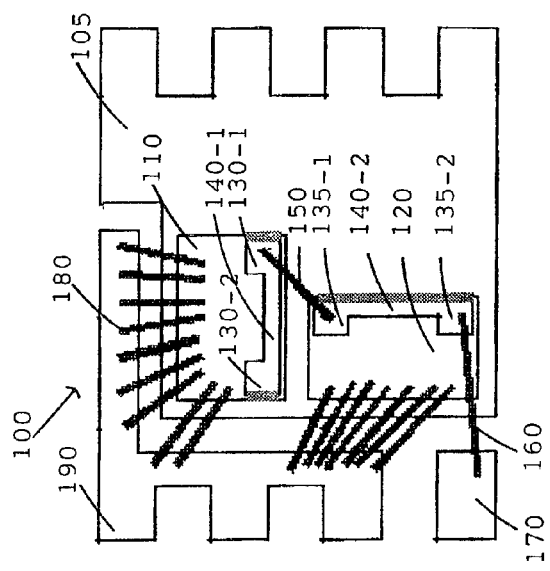
Figure 4D:
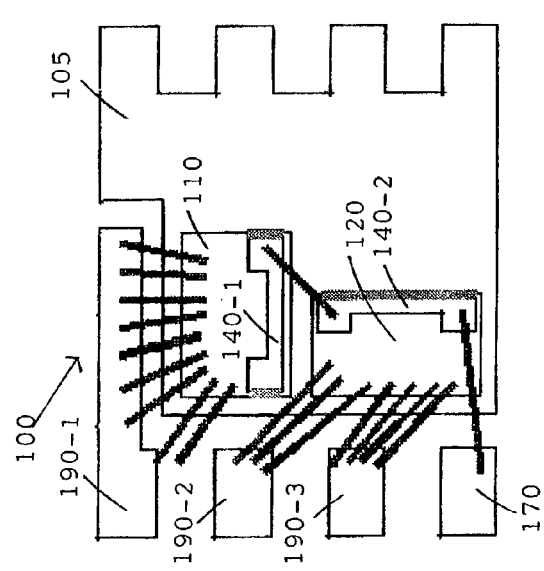

Referring to FIGS. 3A to 3B for two preferred embodiments of this invention showing the implementation of a multiple-die configuration in the standard SOIC8 MOSFET packages. In FIGS. 3A and 3B, two smaller MOSFET chips 60 and 65 are supported on a package substrate 55. A low resistance gate bus, e.g., gate buses 80-1 and 80-2, is formed for connecting two gate contact pads 70-1 and 70-2 and 75-1 and 75-2 disposed on the top surface for each of these separate MOSFET chips 60 and 65 respectively. An inter-chip gate wire 85 is used to interconnect the gate contacts 70-2 and 75-1 disposed on the separate chips 60 and 65. A common gate wire 95 then connects the gate contact 75-2 to a gate terminal 96 of the MOSFET package 50. A plurality of source wires 90 are connected between the source contacts on the separate chips 60 and 65 and source terminals 98 with and without source leads fused respectively. Unlike the prior art chip arrangement shown in FIGS. 2A and 2B, because of the gate buses 80-1 and 80-2 and the inter-chip bus connection 85, the separate chips 60 and 65 can be conveniently arranged without chip rotation. The source wires 90 can be distributed evenly by using only short source wires. The gate buses are also evenly spaced. This arrangement simultaneously allows for minimum gate resistance and source inductance and better thermal spreading. When the MOSFET chips 60 and 65 have small dimension to fit into the packaging substrate 55 as shown in FIGS. 3A and 3B, since there is no need to rotate the die the assembly processes are simplified. Even with slightly more complex packaging process to assemble two separate chips onto a single packaging substrate, the extra efforts are likely to be compensated with better yield when the MOSFET chips are produced as smaller dice.

Referring to FIGS. 4A to 4D for four preferred embodiments of this invention. In FIGS. 3A to 3D, two smaller MOSFET chips 110 and 120 are supported on a package substrate 105 and packaged in parallel with improved layout and connection configuration. As show in these top views, a low resistance gate bus, e.g., gate buses 140-1 and 140-2, is formed for connecting two gate contact pads 130-1 and 130-2, and 135-1 and 135-2 on the top surface for each of these separate MOSFET chips 110 and 120 respectively. An inter-chip gate wire 150 is used to interconnect the gate contacts 130-1 and 135-1 disposed on the separate chips 110 and 120. A common gate wire 160 then connects the gate contact 135-2 to a gate terminal 170 of the MOSFET package 100. A plurality of source wires 180 are connected between the separate chips 110 and 120 and source terminals 190. There are greater separations between the source wires 180 because the MOSFET chips are now separated. With greater separations the inductance between the wires is reduced, leading to a lower package inductance. A particular care is made to design the gate bus 140-1 and 140-2 to avoid a possible associated penalty in gate resistance. As shown in FIGS. 3A to 3D, a wide metal gate bus is used to connect the two gate pads 130-1 and 130-2 on chip 110 and 135-1 and 135-2 on chip 120. Since the two MOSFETs are essentially in parallel, for the composite package as shown, the gate resistance is reduced to about half of that of individual MOSFET. Also, because the dies are separated from each other, the heat dissipated may be spread more evenly over the package area.

Another special feature of the packaging configuration is the use of narrow die with small width as that clearly shown in FIGS. 3A to 4D. The narrow die with small width allows the placement of large number of wires on the metal source area and these wires are spread out extensively with larger spaces. The configuration provides advantages of reducing the package resistance and inductance. In the meantime, there is a technical constraint of maximum allowable aspect ratio in the assembly. A typical allowable aspect ratio is 3:1 while most assembly houses prefer to stay at ratios of under 2:1. When two or three die are used with the aspect ratio of 3:1, an effective aspect ratio of 6:1 or 9:1 is generated respectively. This packaging feature greatly improves the ability to space out the source bond wires.

According to above descriptions, this invention discloses a semiconductor integrated circuit package 100. The integrated circuit package includes at least two semiconductor power chips 110 and 120 configured as paralleled separated power chips in the package. And the package further includes an inter-chip gate wire 150 for connecting a gate contact 130-1 and 140-1 on each of the semiconductor power chips 110 and 120. The semiconductor circuit package 100 further includes lead frames serving as package terminals. In a preferred embodiment, at least one of the lead frames extends along at least two sides of the package 100. In another preferred embodiment, as that shown in FIGS. 3A and 3B, an effective aspect ratio defined as a ratio of an effective length to an effective width of the power chips in the package is a ratio of a sum of lengths of all the semiconductor power chips to a width of anyone of the semiconductor power chips. For example, if chips 60 and 65 each have an aspect ratio of 3:1, an effective aspect ratio of the package 50 becomes 6:1. In another preferred embodiment, at least one of the gate contacts disposed on the semiconductor power chips includes a first gate contact pad and a second gate contact pad interconnected by an inter-pad gate bus. In yet another preferred embodiment, the inter-pad gate bus is a low-resistance gate bus having a resistance less than one-third of a gate resistance (Rg) of each of the power chips. In another preferred embodiment, the first and second semiconductor power chips both having substantially a rectangular shape oriented in an aligned direction. In another preferred embodiment, the first and second semiconductor power chips both having substantially a rectangular shape oriented in a mutually perpendicular direction. In another preferred embodiment, the package further includes a gate terminal, and a gate wire interconnecting the gate terminal and the gate contact. In another preferred embodiment, the integrated circuit is a metal-oxide semiconductor field-effect transistor (MOSFET) device, and the leadframe includes a source terminal and a drain terminal.

This invention also discloses a semiconductor integrated circuit (IC) package that includes a semiconductor power chip having a gate contact pad disposed thereon. And, at least two parallel gate wires interconnect the gate contact pad and a gate terminal is disposed near the gate contact pad. In a preferred embodiment, the package further includes a leadframe disposed near the semiconductor power chip and a plurality of conductive wires interconnecting between the semiconductor power chip and the leadframe. In another preferred embodiment, the leadframe has a first section extended along a first side of the package and a second section extended along a second side of the package. In another preferred embodiment, the semiconductor chips having a wire bonding area extended along the first section and the second section of the leadframe for bonding the conductive wires thereon. In another preferred embodiment, the integrated circuit is a metal-oxide semiconductor field-effect transistor (MOSFET) device. And, the leadframe includes a source terminal and a drain terminal.

This invention further discloses a semiconductor integrated circuit (IC) package that includes a semiconductor power chip has at least two gate contact pads disposed thereon. And, at least two parallel gate wires interconnect each of the two contact pads and a gate terminal disposed near the gate contact pads. In a preferred embodiment, a leadframe disposed near the semiconductor power chip and a plurality of conductive wires interconnecting between the semiconductor power chip and the leadframe. In another preferred embodiment, the leadframe having a first section extended along a first side of the package and a second section extended along a second side of the package. In another preferred embodiment, the semiconductor chips have a wire bonding area extended along the first section and the second section of the leadframe for bonding the conductive wires thereon.

In a preferred embodiment, this invention further discloses a semiconductor power chip that has a first and a second gate contact pads. The semiconductor power chip further an inter-pad gate bus interconnecting said first and second gate contact pads wherein said inter-pad gate bus is a low-resistance gate bus having a resistance less than one-third of a gate resistance of said power chips.

This invention further discloses a method for increasing an effective aspect ratio of a semiconductor integrated circuit (IC) package for decreasing package resistance and inductance. The method includes a step of separating a semiconductor power chip into at least two rectangular-shaped power chips for increasing the effective aspect-ratio of the IC package. In a preferred embodiment, the method further includes a step of arranging the two rectangular-shaped power chip in an aligned orientation. In another preferred embodiment, the method further includes a step of arranging the two rectangular-shaped power chip in a mutually perpendicular orientation. In a preferred embodiment, the method further includes a step of disposing a gate contact on each of the power chips and interconnecting the gate contacts with an inter-chip gate wire. In a preferred embodiment, the method further includes a step of disposing at least a second gate contact on one of the power chips and interconnecting the gate contacts on the power chip with an inter-pad gate bus. In another preferred embodiment, the step of interconnecting the gate contacts with the inter-pad gate bus is step of forming the inter-pad gate bus as a low-resistance gate bus having a resistance less than one-third of a gate resistance (Rg) of each of the power chips.

Figure 5:
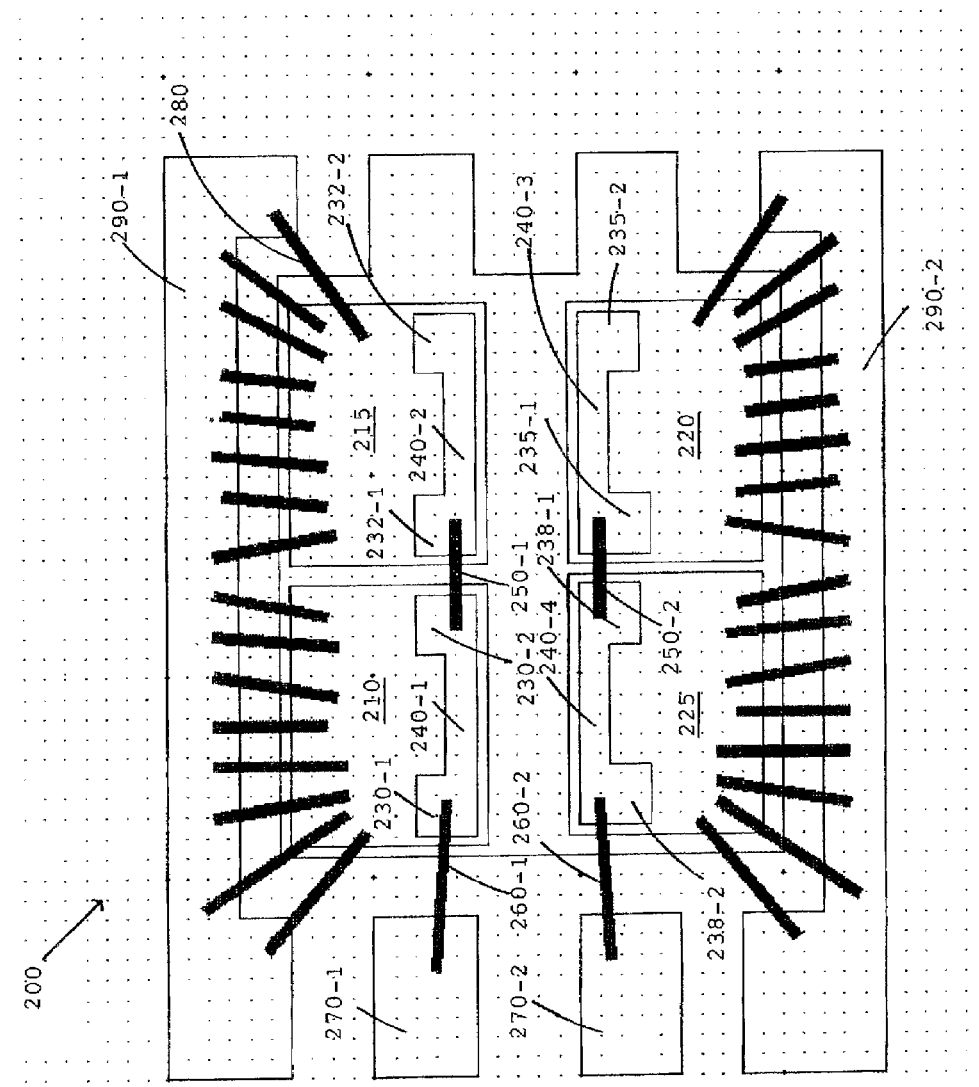
FIG. 5 shows a top view of an integrated circuit package as another preferred embodiment of this invention.

A great number of variations on this multi-device scheme may be constructed. The number of die paralleled is limited only by the package size, lead count, die size, application requirements and target cost. FIG. 5 is another exemplary embodiment of this invention where four-paralleled die are implemented according to the configuration of this invention. Four separate MOSFET chips 210, 215, 220 and 225 are supported on a package substrate 205 and packaged in parallel with improved layout and connection configuration. As show in the top view, a low resistance gate bus, e.g., gate buses 240-1, 240-2, 240-3 and 240-4, are formed for connecting four sets of gate contact pads 230-1 and 230-2, 232-1 and 232-2, 235-a and 235-2 and 238-1 and 238-2 on the top surface for each of these separate MOSFET chips 210, 215, 220 and 225 respectively. An inter-chip gate wire 250-1 and 250-2 used to interconnect the gate contacts 230-2 and 232-1 disposed on the separate chips 210 and 215 and the gate contacts 235-1 and 238-1 disposed on the separate chips 220 and 225. Two common gate wires 260-1 and 260-2 then connects two gate contact 230-1 and 238-2 to two gate terminals 270-1 and 270-2 of the MOSFET package 200. A plurality of source wires 280 are connected between the separate four chips and source terminals 290-1 and 290-2. There are greater separations between the source wires 280 because the MOSFET chips 210, 215, 220 and 225 are now separated. With greater separations the inductance between the wires is reduced, leading to a lower package inductance. A particular care is made to design the gate bus 240-1 to 240-4 to avoid a possible associated penalty in gate resistance. As shown in FIG. 4, wide metal gate buses are used to connect between these gate pads. Since the four MOSFETs are essentially in parallel, for the composite package as shown, the gate resistance is reduced to about one fourth of that of individual MOSFET. Also, because the dice are separated from each other, the heat dissipated may be spread more evenly over the package area.

Figure 6A:
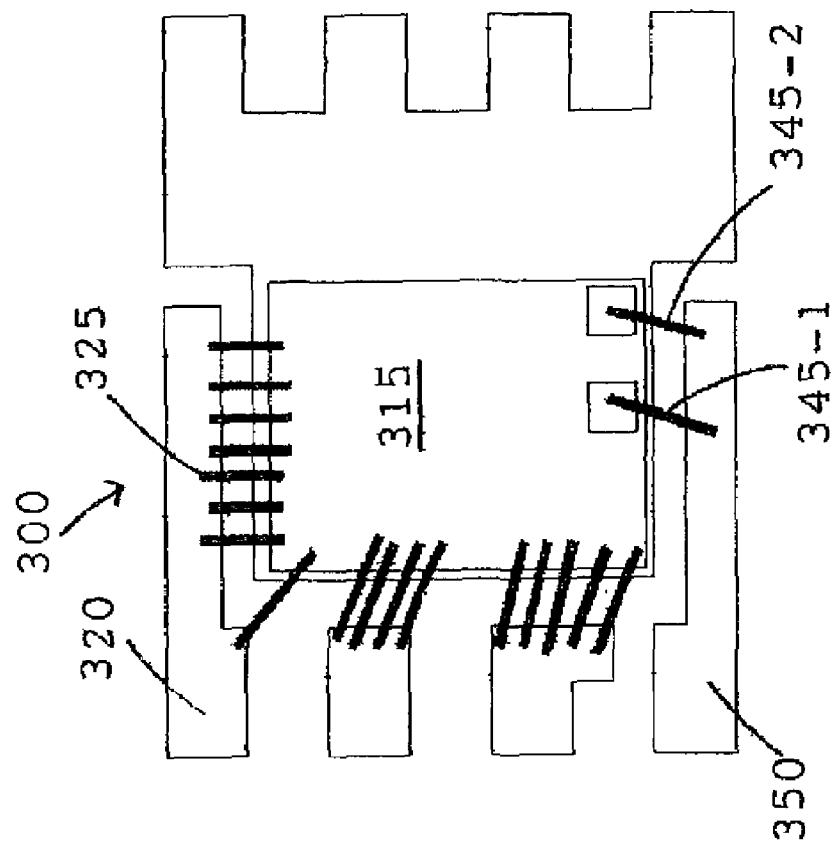
FIGS. 6A and 6B show a top views of an integrated circuit packages as alternate preferred embodiments of this invention.
Figure 6B:
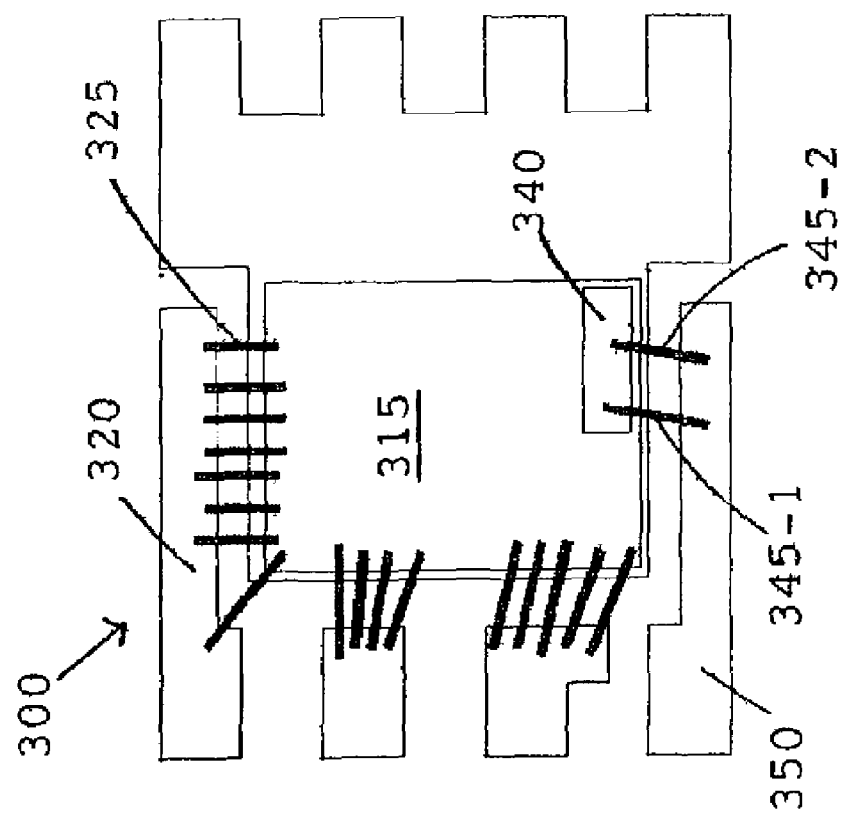

FIGS. 6A and 6B show alternate preferred embodiments of this invention. As the gate resistance and device speed are increased, the resistance and the inductance of the gate bonding wire may significantly reduce the switching speed of a device. FIGS. 6A and 6B show an improved packaging configuration to reduce the inductance and resistance of the gate bonding wires. FIGS. 6A and 6B show a MOSFET package 300 which includes a MOSFET device 315, i.e., the chip, connected to lead frames 320 by the use of source bonding wires 325. The source wires 325 are formed to dispose on the source contact surface near the lead frames 320 such that the wires are shorter and easier to maneuver in the wiring processes. FIG. 6A shows a method to reduce the resistance and inductance of the gate bonding wire by implementing a configuration with multiple wires 345-1 and 345-2 connected from the gate pad 340 to the gate terminal 350. The size of a gate pad 340 is increased in order to accommodate multiple wire connection. FIG. 6B shows a preferred configuration by making use of two isolated gate pads 340-1 and 340-2. Each pad has approximately an area of six square mils. Additional loss of silicon area caused by large gate pad is reduced. The isolated gate pads 340-1 and 340-2 are further spread apart to reduce the gate inductance. In addition to above preferred embodiments, more embodiments are disclosed in another Patent Application entitled "Integrated Circuit Package for Semiconductor Devices with Improved Electric Resistance and Inductance," filed by Applicant: Leeshawn Luo et al. assigned to a same Assignee of this Application. The disclosures made in that Application is hereby incorporated by reference in this Application.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

We claim:

1. A semiconductor integrated circuit package comprising:
at least a first and a second semiconductor power chips configured as spatially separated power chips mounting on a same packaging substrate each having an elongated side for disposing bonding wires on both of said first and second semiconductor chips to extend to a leadframe disposed along said elongated side for increasing a distance between bonding wires in said package to reduce parasitic inductance between said bonding wires; and
each of said semiconductor chips having a gate contact pad and at least one inter-chip gate wire interconnecting at least two gate contact pads disposed on said semiconductor power chips.

2. The package according to claim 1 wherein:
at least one of said semiconductor power chips includes a first gate contact pad and a second gate contact pad disposed near two opposite corner over said elongated side on said at lest one of semiconductor power chips wherein said first gate contact pad and said second gate contact pad are interconnected by an inter-contact-pad gate bus extending from said first contact pad to second contact pad along said elongate side of said semiconductor power chip.

3. The package according to claim 2 wherein:
said inter-contact-pad gate bus is a low-resistance gate bus having a bus width slightly smaller than said first and second gate contact pads and having a resistance less than one-third of a gate resistance (Rg) of each of said semiconductor power chips.

4. The package according to claim 1 wherein:
said first and second semiconductor power chips both having substantially a rectangular shape oriented in an aligned direction wherein said inter-chip gate wire is further connected between said gate contact pads substantially along said aligned direction and disposed on adjacent locations respectively on said first and on said second semiconductor power chips whereby a short inter-chip gate wire is employed.

5. The package according to claim 1 wherein:
said first and second semiconductor power chips both having substantially a rectangular shape oriented along two mutually perpendicular directions with said leadframe extending along said two perpendicular directions for disposing said bonding wires extended from said elongated side of each of said semiconductor power chips.

6. The package according to claim 1 further comprising:
said first and second semiconductor power chips both having substantially a rectangular shape oriented along two mutually perpendicular directions wherein said inter-chip gate wire is further connected between said gate contact pads along a tilt angle relative to said two perpendicular directions and said contact pads are disposed near two adjacent corners respectively on said first and on said second semiconductor power chips whereby a short inter-chip gate wire is employed.

7. The package according to claim 1 wherein:
said first and second semiconductor power chips both having substantially a rectangular shape oriented in an aligned direction wherein said leadframe further extending along an elongate direction and also along an perpendicular direction for disposing bonding wires extended from both said elongated side and also extended from a shorter side perpendicular to said elongated side of each of said first and second semiconductor power chips.

8. The package according to claim 1 wherein:
said semiconductor chips having a plurality of bonding wires interconnected between said leadframe and a source metal on said semiconductor power chips and said semiconductor chips having one gate wire connected to a gate terminal on said leadframe.

9. The package according to claim 1 wherein:
said semiconductor chips having a plurality of bonding wires interconnected between said leadframe and a source metal on said semiconductor power chips and said semiconductor chips having two gate wires connected from one gate pad to a gate terminal on said leadframe.

10. The package according to claim 1 wherein:
said semiconductor power chips further comprising a metal-oxide semiconductor field-effect transistor (MOSFET) device; and
said leadframe includes a source terminal, a gate terminal and a drain terminal.

11. The package according to claim 1 wherein:
said first and second semiconductor power chips each having a length to width ratio about L:W and said package having a length to width ratio of about 2 L:W wherein said leadframe disposed along a longitudinal direction of said package having a length of about 2 L to provide a greater length for disposing said bonding wires extended from said first and second semiconductor power chips.

12. The package according to claim 1 wherein:
said first and second semiconductor power chips each having a length to width ratio about L:W and said package having a length to width ratio of about 2 L:W wherein said leadframe disposed along a longitudinal direction of said package having a length of about 2 L and also along a width direction having a length of about W to further expand a length for disposing said bonding wires extended from said first and second semiconductor power chips.

13. The package according to claim 1 wherein:
said first and second semiconductor power chips each having a length to width ratio about 3:1 and said package having a length to width ratio of about 6:1 wherein said leadframe disposed along a longitudinal direction of said package to provide a greater length for disposing said bonding wires extended from said first and second semiconductor power chips.

14. The package according to claim 1 wherein:
said lead frame disposed on all sides of said package for further increasing a length of said leadframe for disposing said bonding wires extended from all sides of said package to said leadframe.

15. The package according to claim 1 wherein:
said semiconductor power chips further comprising a first and a second metal-oxide semiconductor field-effect transistor (MOSFET) chips and said packaging substrate further includes a common drain for said MOSFET chips.

16. A semiconductor integrated circuit (IC) package comprising:
a semiconductor power chip having at least two electrically interconnected and physically separated gate contact pads disposed thereon; and
at least two substantially parallel gate wires interconnecting each of said two contact pads and a gate terminal disposed on a lead frame near said gate contact pads for reducing a gate resistance between said semiconductor chip and said leadframe.

17. The package according to claim 16 wherein:
said leadframe disposed along at least a first elongated side and along a shorter second side of said package wherein said substantially parallel gate wires extending from said shorter second side of said package to said leadframe and other bonding wires extending from said elongated first side of said package to said leadframe whereby said bonding wires having a greater length to distribute along said elongated side to reduce a parasitic inductance between said bonding wires.

18. The package according to claim 16 wherein:
said two electrically interconnected gate contact pads are disposed adjacent to each other on an edge near said leadframe whereby said two substantially parallel gate wires having a short length.

19. The package according to claim 16 wherein:
said package having a length to width ratio of about 3:1 with said substantially parallel gate wires extended from a side of a shorter length and a plurality of source bonding wires extended from a side of greater length.

20. The package according to claim 16 wherein:
said semiconductor power chip comprising a metal-oxide semiconductor field-effect transistor (MOSFET) device; and
said leadframe includes a source terminal for connecting to a source region of said MOSFET device via a plurality of bonding wires extending from a different side of said semiconductor power chip away from said gate pads.

21. A semiconductor integrated circuit (IC) package comprising:
at least a first and a second semiconductor power chips configured as spatially separated power chips in said package wherein at least two of said power chips having a first gate contact pad and a second gate contact pad for separately connecting to a first gate terminal and a second gate terminal of a leadframe of said IC package for reducing a gate resistance of said IC package; and
at least one of said semiconductor power chips includes a first gate contact pad and a second gate contact pad disposed near two opposite corners on said at leas one semiconductor power chip wherein said first gate contact pad and said second gate contact pad are interconnected by an inter-pad gate bus.

22. The package according to claim 21 wherein:
said inter-pad gate bus is a low-resistance gate bus having a bus width slightly smaller than said first and second gate contact pads and having a resistance less than one-third of a gate resistance of each of said semiconductor power chips.

* * * * *